(12) United States Patent
Um (10) Patent No.: US 9,773,561 B1
(45) Date of Patent: Sep. 26, 2017

(54) NONVOLATILE MEMORY DEVICE AND DATA STORAGE DEVICE INCLUDING THE SAME

(71) Applicant: SK hynix Inc., Gyeonggi-do (KR)

(72) Inventor: Gi Pyo Um, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/609,540

(22) Filed: May 31, 2017

Related U.S. Application Data

(63) Continuation of application No. 15/081,306, filed on Mar. 25, 2016, now Pat. No. 9,697,903.

(30) Foreign Application Priority Data

Dec. 30, 2015 (KR) ........................ 10-2015-0189481

(51) Int. Cl.
*G11C 16/16* (2006.01)
*G11C 16/14* (2006.01)
*G11C 16/34* (2006.01)

(52) U.S. Cl.
CPC .......... *G11C 16/14* (2013.01); *G11C 16/3445* (2013.01); *G11C 16/16* (2013.01); *G11C 16/34* (2013.01)

(58) Field of Classification Search
CPC ...... G11C 16/16; G11C 16/14; G11C 16/3445
USPC ..................................................... 365/185.29
See application file for complete search history.

(56) References Cited

U.S. PATENT DOCUMENTS 6,331,953 B1 * 12/2001 Wang .................. G11C 11/5671
365/185.29

* cited by examiner

*Primary Examiner* — Jason Lappas
(74) *Attorney, Agent, or Firm* — IP & T Group LLP (57) ABSTRACT

A data storage device includes a nonvolatile memory device; and a controller suitable for providing a normal erase command or a fine erase command to the nonvolatile memory device, wherein the nonvolatile memory device performs a first normal erase loop in which a first normal erase voltage and an erase verify voltage are applied to erase target memory cells, according to the normal erase command, and performs a first fine erase loop in which a first fine erase voltage and the erase verify voltage are applied to the erase target memory cells, according to the fine erase command.

6 Claims, 11 Drawing Sheets

NONVOLATILE MEMORY DEVICE AND DATA STORAGE DEVICE INCLUDING THE SAME

CROSS-REFERENCES TO RELATED APPLICATION

This application is a continuation of U.S. patent application Ser. No. 15/081,306 filed on Mar. 25, 2016, which claims priority under 35 U.S.C. §119(a) to Korean application number 10-2015-0189481, filed on Dec. 30, 2015, in the Korean Intellectual Property Office. The disclosure of each of the foregoing application is incorporated herein by reference in its entirety.

BACKGROUND

1. Technical Field

Various embodiments generally relate to a data storage device including a nonvolatile memory device and, more particularly, to a data storage device capable of densely forming an erased state distribution of memory cells included in a nonvolatile memory device.

2. Related Art

The paradigm for the computer environment has shifted into ubiquitous computing so that computer systems can now be used anywhere and at any time. As a result, use of portable electronic devices, such as mobile phones, digital cameras, and notebook computers has rapidly increased. Generally, such portable electronic devices use a data storage device comprising a memory device. The data storage device is typically used as an auxiliary memory device of the portable electronic devices.

A data storage device using a memory device may provide excellent stability and durability, high information access speed, and low power consumption, since there is no mechanical driving part. Data storage devices having such advantages include a universal serial bus (USB) memory device, memory cards having various interfaces, and a solid state drive (SSD).

For portable electronic devices to be able to play large files such as music or video files, data storage devices having large storage capacity are required. High storage capacity data storage devices employ, as storage media, memory devices having high integration degree in memory cells, such as, for example, flash memory devices.

SUMMARY

Various embodiments are directed to a data storage device capable of densely forming an erased state distribution of memory cells included in a nonvolatile memory device.

In an embodiment, a data storage device may include: a nonvolatile memory device; and a controller configured to provide a normal erase command or a fine erase command to the nonvolatile memory device, wherein the nonvolatile memory device performs a first normal erase loop in which a first normal erase voltage and an erase verify voltage are applied to erase target memory cells, according to the normal erase command, and performs a first fine erase loop in which a first fine erase voltage and the erase verify voltage are applied to the erase target memory cells, according to the fine erase command.

In an embodiment, a nonvolatile memory device may include: memory cells; a voltage generator configured to generate voltages to be provided to the memory cells; and a control logic configured to perform a first normal erase loop in which the voltage generator is controlled such that a first normal erase voltage and an erase verify voltage are applied to erase target memory cells among the memory cells, according to a normal erase command provided from an external device, and perform a first fine erase loop in which the voltage generator is controlled such that a first fine erase voltage and the erase verify voltage are applied to the erase target memory cells, according to a fine erase command provided from the external device.

According to the embodiments, it is possible to densely form an erased state distribution of memory cells included in a nonvolatile memory device.

DETAILED DESCRIPTION

The present invention, advantages, features and methods thereof will become more apparent after a reading of the following exemplary embodiments in conjunction with the drawings. The present invention may, however, be embodied in different forms and should not be construed as being limited to the embodiments set forth herein. Rather, these embodiments describe the present invention in sufficient detail to allow a person skilled in the relevant art to practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used herein, it is to be appreciated that the terminology used is for the purpose of describing particular embodiments only and is not intended to limit the scope of the present invention.

As used herein, the term "and/or" includes any and all combinations of one or more of the associated listed items.

It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" "including," "comprises," "comprising," "has," "having" and the like when used in this specification, specify the presence of at least one recited feature, step, operation, and/or elements, but do not preclude the presence or addition of one or more other un-recited features, steps, operations, and/or elements.

Hereinafter, a nonvolatile memory device, a data storage device including the same, and other embodiments of the invention will be described below with reference to the accompanying drawings.

Figure 1:
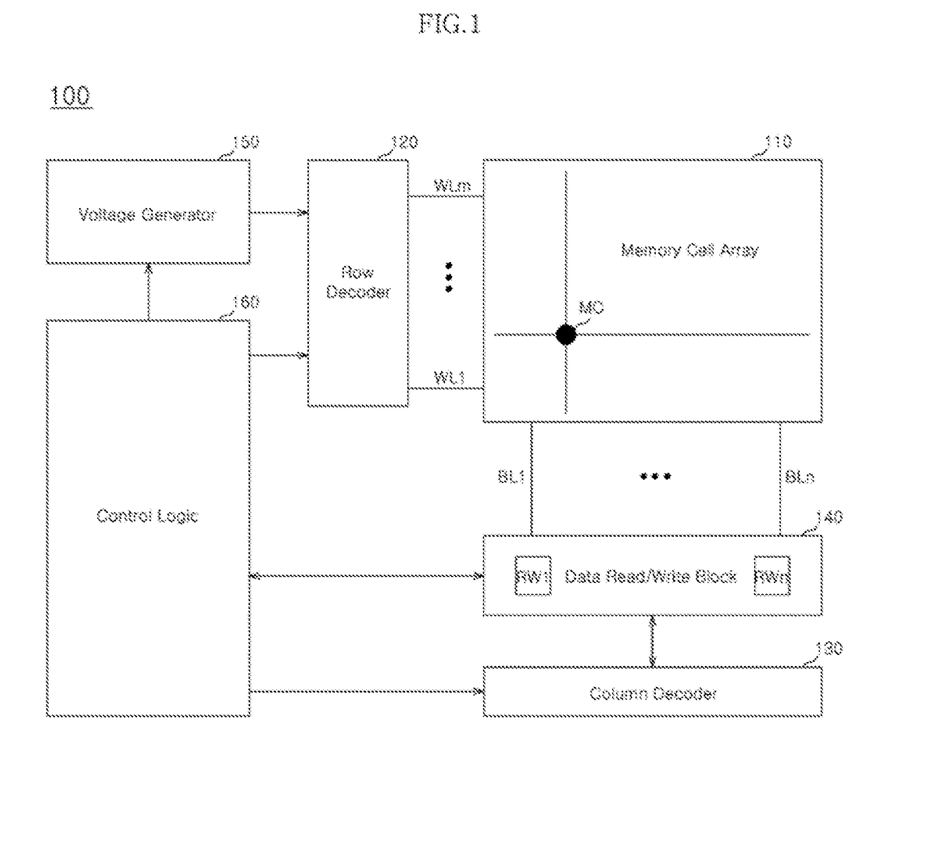
FIG. 1 is a block diagram of a nonvolatile memory device, according to an embodiment of the invention.

FIG. 1 is a block diagram illustrating a representation of an example of a nonvolatile memory device according to an embodiment.

Referring to FIG. 1, a nonvolatile memory device 100, according to an embodiment of the invention, may include a memory cell array 110, a row decoder 120, a column decoder 130, a data read/write block 140, a voltage generator 150, and a control logic 160.

The memory cell array 110 may include memory cells MC arranged at areas where word lines WL1 to WLm and bit lines BL1 to BLn intersect with each other. The memory cells may be grouped into different access units for erase and program (write) or read operations. For example, the memory cells may be grouped into an access unit, such as a memory block as an erase unit and a page as a program and read unit.

The row decoder 120 may be coupled with the memory cell array 110 through the word lines WL1 to WLm. Operation of the row decoder 120 may be controlled by the control logic 160. The row decoder 120 may decode an address provided from an external device (not shown). The row decoder 120 may select one of the word lines WL1 to WLm and drive the selected one and the unselected word lines, based on a decoded address. The row decoder 120 may provide word line voltages provided from the voltage generator 150, to the word lines WL1 to WLm as may be needed.

The data read/write block 140 may be coupled with the memory cell array 110 through the bit lines BL1 to BLn. The data read/write block 140 may include a plurality of read/write circuits RW1 to RWn corresponding to the bit lines BL1 to BLn, respectively. The data read/write block 140 may operate according to control of the control logic 160. The data read/write block 140 may operate as a write driver or a sense amplifier according to an operation mode. For example, in a write operation, the data read/write block 140 may operate as a write driver which stores data provided from the external device, in the memory cell array 110. For another example, in a read operation, the data read/write block 140 may operate as a sense amplifier which reads out data from the memory cell array 110.

An operation of storing data in the memory cell array 110 may be referred to as a write operation or a program operation. For the sake of convenience in explanation, hereafter, an operation of storing data in the memory cell array 110 will be referred to as a program operation.

Operation of the column decoder 130 may be controlled by the control logic 160. The column decoder 130 may decode an address provided from an external device (not shown). The column decoder 130 may couple the read/write circuits RW1 to RWn of the data read/write block 140 which correspond to respective bit lines BL1 to BLn with data input/output lines or data input/output buffers (not shown), based on a decoded address.

The voltage generator 150 may generate voltages to be used in internal operations of the nonvolatile memory device 100, according to control of the control logic 160. The voltages generated by the voltage generator 150 may be applied to the memory cells of the memory cell array 110. For example, in a program operation, a program voltage and a program verify voltage may be applied to a word line of memory cells for which the program operation is to be performed. For another example, in an erase operation, an erase voltage may be applied to an area of memory cells for which the erase operation is to be performed, and an erase verify voltage may be applied to word lines of memory cells for which the erase operation is to be performed. For still another example, in a read operation, a read voltage may be applied to a word line of memory cells for which the read operation is to be performed.

The control logic 160 may control general operations of the nonvolatile memory device 100, based on control signals provided from an external device. For example, the control logic 160 may control main operations of the nonvolatile memory device 100, such as read, program and erase operations of the nonvolatile memory device 100.

The control logic 160 may control two erase modes. In other words, the control logic 160 may control a normal erase mode and a fine erase mode according to an erase command provided from the external device.

For instance, if a normal erase command is provided from the external device, the control logic 160 may perform a normal erase operation for memory cells of the memory cell array 110 which are requested to be erased. In order to perform the normal erase operation, the control logic 160 may control the voltage generator 150 to generate an erase voltage and an erase verify voltage to be used in the normal erase operation.

For another instance, if a fine erase command is provided from the external device, the control logic 160 may perform a fine erase operation for memory cells of the memory cell array 110 which are requested to be erased. In order to perform the fine erase operation, the control logic 160 may control the voltage generator 150 to generate an erase voltage and an erase verify voltage to be used in the fine erase operation.

The normal and the fine erase operations will be described below in more detail.

Figure 2:
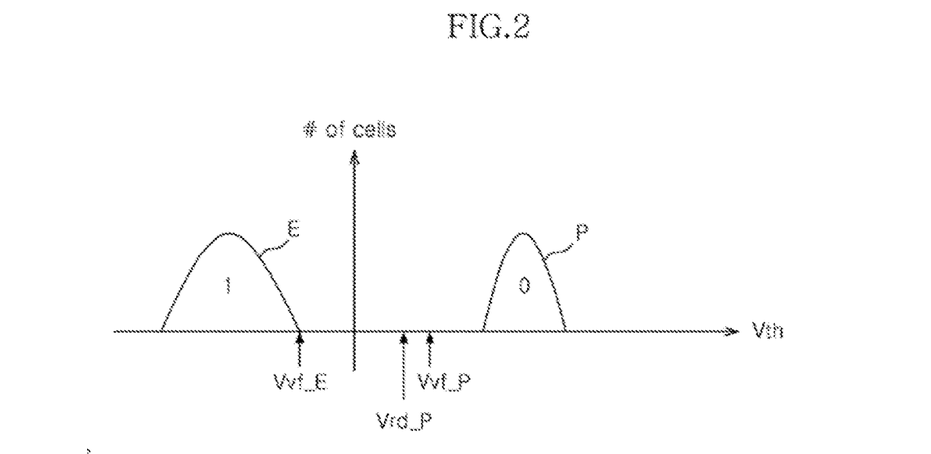
FIG. 2 is a diagram illustrating an example of threshold voltage distributions of memory cells included in a memory cell array of the nonvolatile memory device of FIG. 1.

FIG. 2 is a diagram illustrating an example of threshold voltage distributions of memory cells included in the memory cell array 110 of the memory device 100 of FIG. 1.

As shown in FIG. 2, each memory cell may be a single level cell (SLC) type. Each SCL type memory cell may be erased to have a threshold voltage of an erased state E, and may be programmed to have a threshold voltage of a programmed state P.

In a read operation, a read voltage Vrd_P having a voltage level between the erased state E and the programmed state P may be applied to memory cells. If the read voltage Vrd_P is applied, a memory cell having a threshold voltage of the erased state E may be identified as an on cell which stores data "1," and a memory cell having a threshold voltage of the programmed state P may be identified as an off cell which stores data "0."

In a program operation, in order to determine whether memory cells are completely programmed, a program verify voltage Vvf_P having a voltage level higher than the read voltage Vrd_P may be applied to the memory cells. If the program verify voltage Vvf_P is applied, a memory cell which has a threshold voltage lower than or equal to the program verify voltage Vvf_P may be identified as an on cell which stores data "1," that is, a memory cell which is not completely programmed, and a memory cell which has a threshold voltage higher than the program verify voltage Vvf_P may be identified as an off cell which stores data "0," that is, a memory cell which is completely programmed.

In an erase operation, in order to determine whether memory cells applied with an erase voltage are completely erased, an erase verify voltage Vvf_E may be applied to the memory cells. If the erase verify voltage Vvf_E is applied, a memory cell which has a threshold voltage lower than or equal to the erase verify voltage Vvf_E may be identified as an on cell which stores data "1," that is, a memory cell which is completely erased, and a memory cell which has a threshold voltage higher than the erase verify voltage Vvf_E may be identified as an off cell which stores data "0," that is, a memory cell which is not completely erased.

Figure 3:
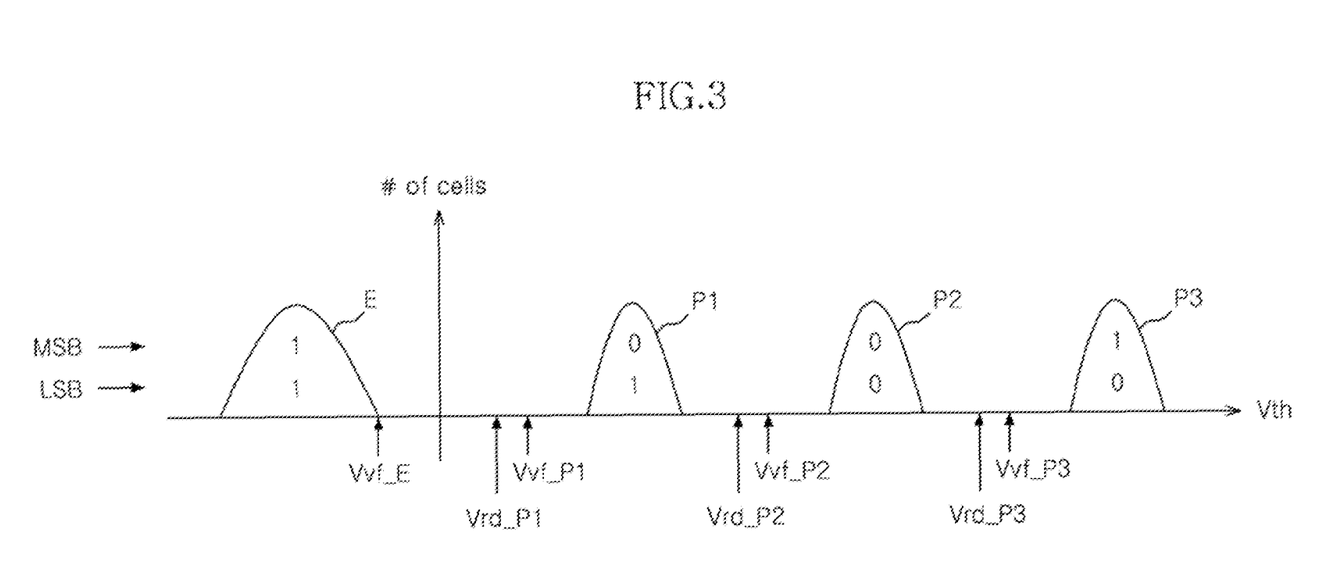
FIG. 3 is a diagram illustrating an example of threshold voltage distributions of memory cells included in a memory cell array of the nonvolatile memory device of FIG. 1.

FIG. 3 is a diagram illustrating a representation of an example of threshold voltage distributions of memory cells included in the memory cell array 110 of FIG. 1.

As shown in FIG. 3, each memory cell may be a 2-bit multi-level cell (MLC) type. Each memory MLC type cell may be erased to have a threshold voltage of an erased state E, and may be programmed to have a threshold voltage of any one among a plurality of programmed states P1, P2 and P3.

In a read operation, any one of a first read voltage Vrd_P1 having a voltage level between the erased state E and a first programmed state P1, a second read voltage Vrd_P2 having a voltage level between the first programmed state P1 and a second programmed state P2, and a third read voltage Vrd_P3 having a voltage level between the second programmed state P2 and a third programmed state P3 may be applied to memory cells.

If the second read voltage Vrd_P2 is applied, memory cells having threshold voltages of the erased state E and the first programmed state P1 may be identified as on cells which store LSB data "1," and memory cells having threshold voltages of the second programmed state P2 and the third programmed state P3 may be identified as off cells which store LSB data "0."

If the first read voltage Vrd_P1 is applied, a memory cell having a threshold voltage of the erased state E may be identified as an on cell which stores MSB data "1," and a memory cell having a threshold voltage of the first programmed state P1 may be identified as an off cell which stores MSB data "0."

If the third read voltage Vrd_P3 is applied, a memory cell having a threshold voltage of the second programmed state P2 may be identified as an on cell which stores MSB data "0," and a memory cell having a threshold voltage of the third programmed state P3 may be identified as an off cell which stores MSB data "1."

In a program operation, in order to determine whether memory cells are completely programmed, program verify voltages Vvf_P1, Vvf_P2 and Vvf_P3 having voltage levels higher than the read voltages Vrd_P1, Vrd_P2 and Vrd_P3, respectively, may be applied to the memory cells.

If the program verify voltage Vvf_P1 is applied to memory cells which should be programmed to the first programmed state P1, a memory cell which has a threshold voltage lower than or equal to the program verify voltage Vvf_P1 may be identified as an on cell which stores data "1," that is, a memory cell which is not completely programmed, and a memory cell which has a threshold voltage higher than the program verify voltage Vvf_P1 may be identified as an off cell which stores data "0," that is, a memory cell which is completely programmed.

If the program verify voltage Vvf_P2 is applied to memory cells which should be programmed to the second programmed state P2, a memory cell which has a threshold voltage lower than or equal to the program verify voltage Vvf_P2 may be identified as an on cell which stores data "1," that is, a memory cell which is not completely programmed, and a memory cell which has a threshold voltage higher than the program verify voltage Vvf_P2 may be identified as an off cell which stores data "0," that is, a memory cell which is completely programmed.

If the program verify voltage Vvf_P3 is applied to memory cells which should be programmed to the third programmed state P3, a memory cell which has a threshold voltage lower than or equal to the program verify voltage Vvf_P3 may be identified as an on cell which stores data "1," that is, a memory cell which is not completely programmed, and a memory cell which has a threshold voltage higher than the program verify voltage Vvf_P3 may be identified as an off cell which stores data "0," that is, a memory cell which is completely programmed.

In an erase operation, in order to determine whether memory cells applied with an erase voltage are completely erased, an erase verify voltage Vvf_E may be applied to the memory cells. If the erase verify voltage Vvf_E is applied, a memory cell which has a threshold voltage lower than or equal to the erase verify voltage Vvf_E may be identified as an on cell which stores data "1," that is, a memory cell which is completely erased, and a memory cell which has a threshold voltage higher than the erase verify voltage Vvf_E may be identified as an off cell which stores data "0," that is, a memory cell which is not completely erased.

Figure 4:
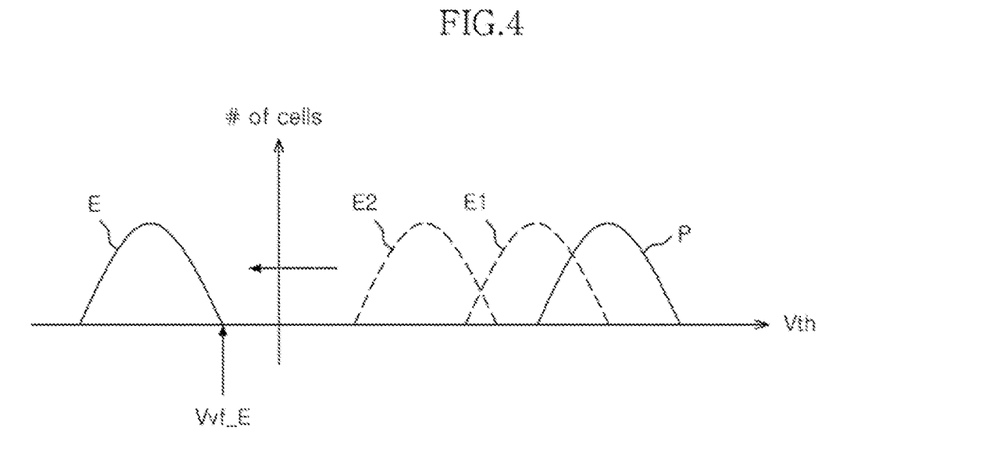
FIGS. 4 and 5 are diagrams illustrating a stepwise erase method, according to an embodiment of the invention.
Figure 5:
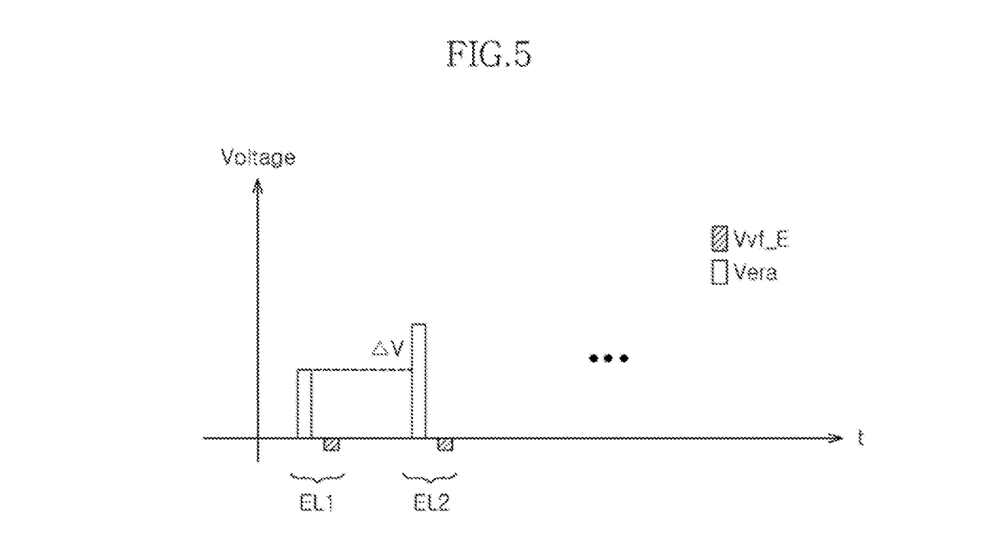

FIGS. 4 and 5 are diagrams illustrating a stepwise erase method, according to an embodiment of the invention.

As shown in FIGS. 4 and 5, in order to reduce the time required for an erase operation and make threshold voltage distributions denser, memory cells may be erased using a stepwise erase method.

According to the stepwise erase method, an erase voltage Vera of one pulse may be applied to a block area of memory cells, and thereafter, an erase verify voltage Vvf_E may be applied to verify whether or not all of the memory cells are erased. Namely, the erase verify voltage Vvf_E may be applied each time the erase voltage Vera of one pulse is applied to memory cells. An erase operation of applying the erase voltage Vera and an erase verify operation of applying the erase verify voltage Vvf_E may constitute an erase loop EL.

After an erase verify operation of a first erase loop EL1 is performed, when it is determined that at least one memory cell which is not completely erased exists, the erase voltage Vera may be increased by an increment ΔV, and a second erase loop EL2 may be performed. That is to say, the erase loop EL may be repeated with the erase voltage VERA being increased in a stepwise manner each time by an increment ΔV until all the memory cells are erased to threshold voltages lower than or equal to the erase verify voltage Vvf_E. If not all the memory cells are erased to the erased state E even though the erase loop EL has been performed a maximum number of times, the erase operation may be ended as a "fail."

Figure 6:
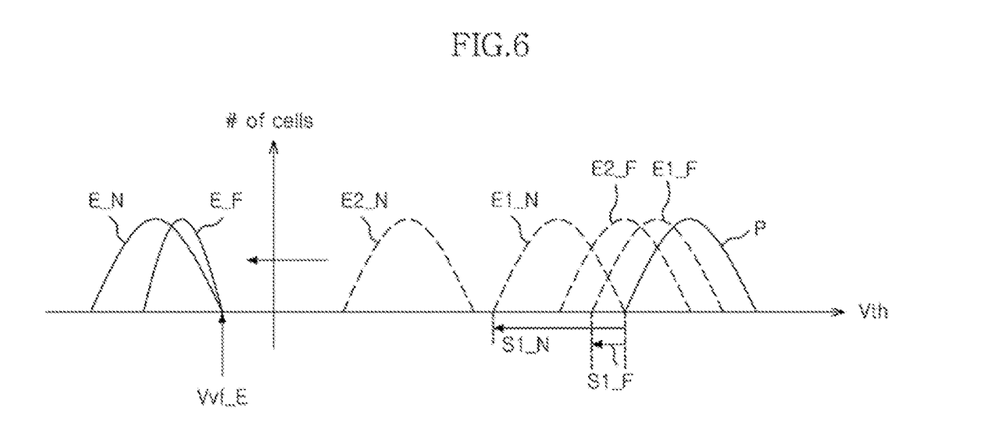
FIGS. 6 to 8 are diagrams illustrating a normal erase operation and a fine erase operation, according to an embodiment of the invention.
Figure 7:
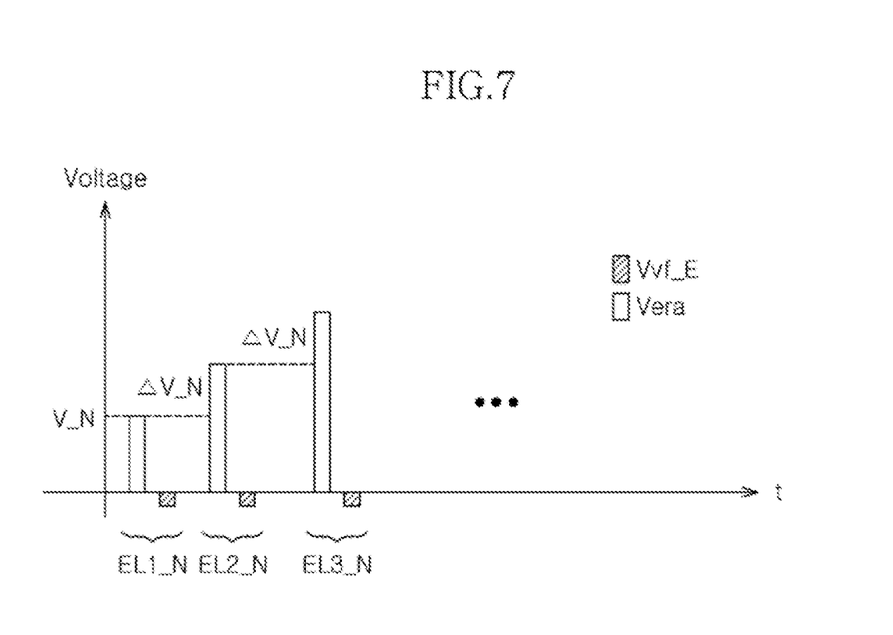
Figure 8:
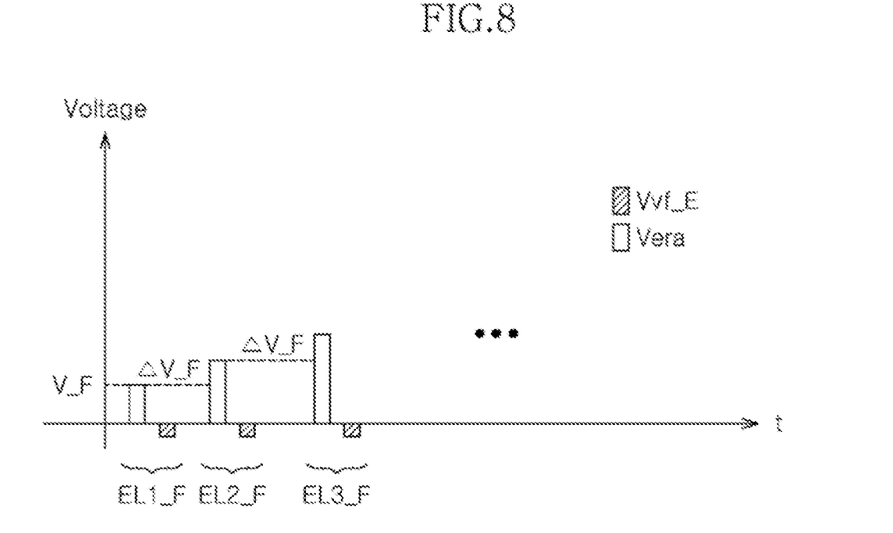

FIGS. 6 to 8 are diagrams illustrating a normal erase operation and a fine erase operation, according to an embodiment of the invention. We note that in FIGS. 6 and 7, symbols including "_N" denote the normal erase operation, whereas including "_F" denote the fine erase operation.

As shown in FIG. 7, while the normal erase operation is performed, normal erase loops EL1_N, EL2_N, EL3_N, . . . may be performed in a stepwise manner. For the sake of convenience in explanation, memory cells for which an erase operation is to be performed, that is, erase target memory cells, will be referred to as memory cells.

When a first normal erase loop EL1_N is performed, a first normal erase voltage V_N may be applied to a block area of the memory cells, and thereafter, an erase verify voltage Vvf_E may be applied to verify whether or not all of the memory cells are erased. When it is determined that not all of the memory cells are erased by the first normal erase loop EL1_N, a second normal erase loop EL2_N may be performed.

When the second normal erase loop EL2_N is performed, a second normal erase voltage V_N+ΔV_N increased by an increment ΔV_N from the first normal erase voltage V_N may be applied to the block area of the memory cells. Thereafter, the erase verify voltage Vvf_E may be applied to verify whether or not the memory cells are erased. When it is determined that not all of the memory cells are erased by the second normal erase loop EL2_N, a third normal erase loop EL3_N may be performed.

When the third normal erase loop EL3_N is performed, a third normal erase voltage V_N+2*ΔV_N increased by the increment ΔV_N from the second normal erase voltage V_N+ΔV_N may be applied to the block area of the memory cells, and thereafter, the erase verify voltage Vvf_E may be applied to verify whether or not all of the memory cells are erased.

When the normal erase loops EL1_N, EL2_N, EL3_N, . . . are performed in a stepwise manner, as in threshold voltage distributions E1_N, E2_N, . . . shown in FIG. 6, the threshold voltages of the memory cells may be gradually shifted from a programmed state P toward a normal erased state E_N. Finally, the memory cells may be erased to have threshold voltages of the normal erased state E_N.

As shown in FIG. 8, while the fine erase operation is performed, fine erase loops EL1_F, EL2_F, EL3_F, . . . may be performed in a stepwise manner. For the sake of convenience in explanation, memory cells for which an erase operation is to be performed, that is, erase target memory cells, will be referred to as memory cells.

When a first fine erase loop EL1_F is performed, a first fine erase voltage V_F may be applied to the block area of the memory cells, and thereafter, the erase verify voltage Vvf_E may be applied to verify whether or not all of the memory cells are erased. When it is determined that not all of the memory cells are erased by the first fine erase loop EL1_F, a second fine erase loop EL2_F may be performed.

When the second fine erase loop EL2_F is performed, a second fine erase voltage V_F+ΔV_F increased by an increment ΔV_F from the first fine erase voltage V_F may be applied to the block area of the memory cells, and thereafter, the erase verify voltage Vvf_E may be applied to verify whether or not all of the memory cells are erased. When it is determined that not all of the memory cells are erased by the second fine erase loop EL2_F, a third fine erase loop EL3_F may be performed.

When the third fine erase loop EL3_F is performed, a third fine erase voltage V_F+2*ΔV_F increased by the increment ΔV_F from the second fine erase voltage V_F+ΔV_F may be applied to the block area of the memory cells, and thereafter, the erase verify voltage Vvf_E may be applied to verify whether or not all of the memory cells are erased.

When the fine erase loops EL1_F, EL2_F, EL3_F, . . . are performed in a stepwise manner, as in threshold voltage distributions E1_F, E2_F, . . . shown in FIG. 6, the threshold voltages of the memory cells may be gradually shifted from the programmed state P toward a fine erased state E_F. Finally, all of the memory cells may be erased to have threshold voltages of the fine erased state E_F.

The voltage level of the first normal erase voltage V_N applied to the memory cells while an initial erase loop (that is, the first normal erase loop EL1_N) of the normal erase loops is performed may be higher than the voltage level of the first fine erase voltage V_F applied to the memory cells while an initial erase loop (that is, the first fine erase loop EL1_F) of the fine erase loops is performed.

The erase voltage increment ΔV_N added to the erase voltage each time the normal erase loop EL1_N, EL2_N, EL3_N, . . . is repeated in a stepwise manner may be larger than the erase voltage increment ΔV_F added to the fine erase voltage each time the fine erase loop EL1_F, EL2_F, EL3_F, . . . is repeated in a stepwise manner.

Since the initial normal erase voltage V_N of the normal erase operation is higher than the initial fine erase voltage V_F of the fine erase operation, and the erase voltage increment ΔV_N of the normal erase operation is larger than the erase voltage increment ΔV_F of the fine erase operation, a threshold voltage shift amount S1_N due to a single normal erase loop may be larger than a threshold voltage shift amount S1_F due to a single fine erase loop. This may mean that a threshold voltage shift amount may be more finely adjusted when the fine erase operation is performed. As a consequence, the erased state E_F of the memory cells for which the fine erase operation is performed may be denser than the erased state E_N of the memory cells for which the normal erase operation is performed.

Figure 9:
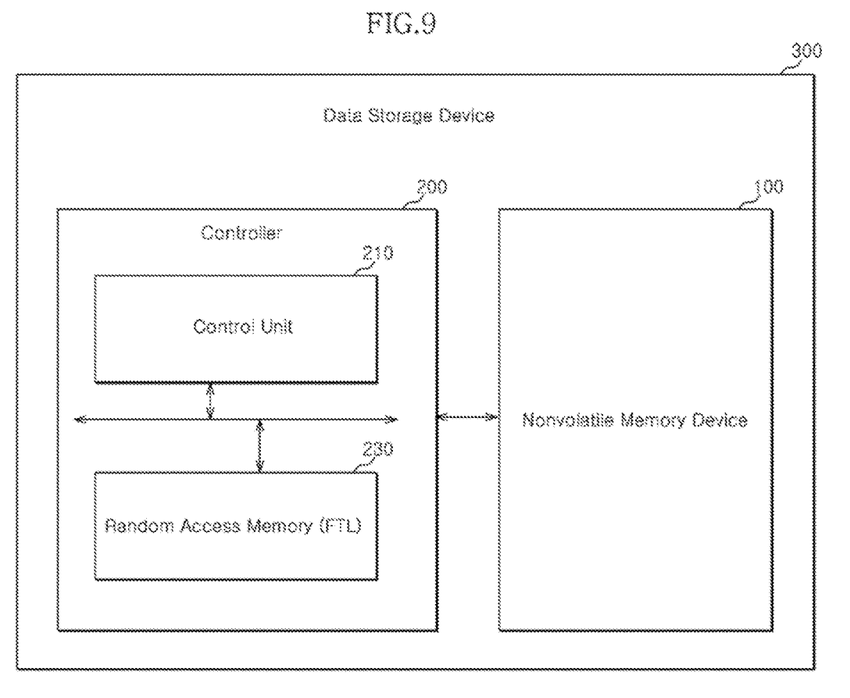
FIG. 9 is a block diagram of a data storage device, according to an embodiment of the invention.

FIG. 9 is a block diagram of a data storage device, according to an embodiment of the invention.

Referring to FIG. 9, a data storage device 300 may store data to be accessed by a host device (not shown), such as a mobile phone, an MP3 player, a laptop computer, a desktop computer, a game player, a TV, an in-vehicle infotainment system, and the like. The data storage device 300 may also be referred to as a memory system.

The data storage device 300 may be manufactured as any one of various kinds of storage devices according to the protocol of an interface which is electrically coupled with the host device. For example, the data storage device 300 may be configured as any one of various kinds of storage devices, such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The data storage device 300 may be manufactured as any one of various kinds of package types. For example, the data storage device 300 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The data storage device 300 may include a nonvolatile memory device 100. The nonvolatile memory device 100 may operate as a storage medium of the data storage device 300. The nonvolatile memory device 100 may be configured by the nonvolatile memory device 100 shown in FIG. 1. The nonvolatile memory device 100 may be configured by any one of various types of nonvolatile memory devices, such as a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, a resistive random access memory (RERAM) using a transition metal oxide and the like.

The data storage device 300 may include a controller 200. The controller 200 may include a control unit 210 and a random access memory 230.

The control unit 210 may control general operations of the controller 200. The control unit 210 may analyze and process a signal or a request which is inputted from the host device. To this end, the control unit 210 may decode and drive a firmware or a software loaded on the random access memory 230. The control unit 210 may be realized in the form of a hardware or in the combined form of a hardware and a software.

The random access memory 230 may store a firmware or a software to be driven by the control unit 210. Also, the random access memory 230 may store data necessary for the driving of the firmware or the software, for example, metadata. That is to say, the random access memory 230 may operate as a working memory of the control unit 210. The random access memory 230 may temporarily store data to be transmitted from the host device to the nonvolatile memory device 100 or from the nonvolatile memory device 100 to the host device. In other words, the random access memory 230 may operate as a data buffer memory or a data cache memory.

Figure 10:
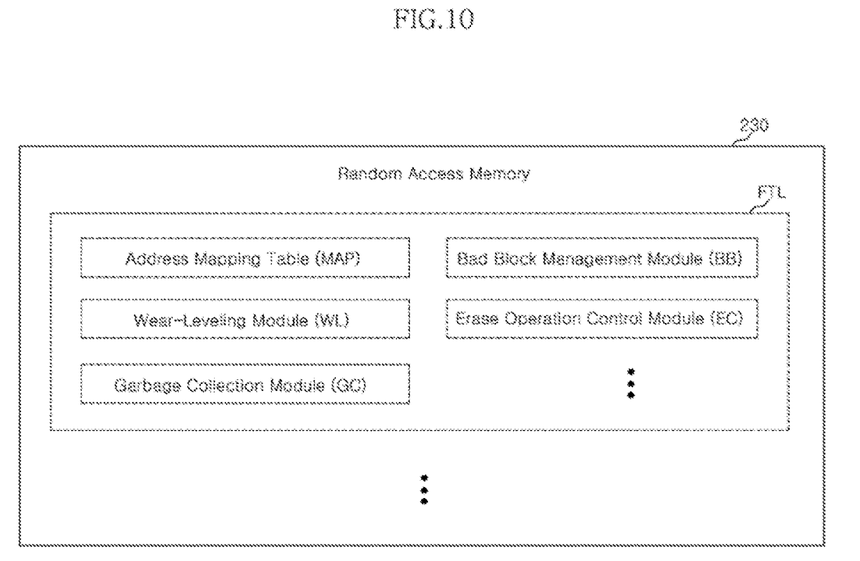
FIG. 10 is a diagram illustrating an example of a firmware or a software to be driven in a random access memory of the data storage device of FIG. 9.

FIG. 10 is a diagram illustrating a firmware or a software to be driven in the random access memory 230 shown in FIG. 9.

In the case where the nonvolatile memory device 100 is configured by a flash memory device, the control unit 210 may control an erase operation in a unit of a memory block, and may control a read or program operation in a unit of a page. Further, in the case where the nonvolatile memory device 100 is configured by a flash memory device, the control unit 210 may perform in advance an erase operation in order to store new data in memory cells which are stored with data.

The control unit 210 of the data storage device 300, which uses a flash memory device as a data storage medium, may drive a firmware or a software referred to as a flash translation layer FTL, to control an operation peculiar to the flash memory device and provide device compatibility to the host device. Through driving of such a flash translation layer FTL, the data storage device 300 may be recognized as a general data storage device such as a hard disk, by the host device.

The flash translation layer FTL loaded on the random access memory 230 may be configured by modules for performing various functions and metadata necessary for driving of the modules. For example, when referring to FIG. 10, the flash translation layer FTL may include an address mapping table MAP, a wear-leveling module WL, a garbage collection module GC, a bad block management module BB, an erase operation control module EC, and so forth.

In the case where the host device accesses the data storage device 300 (for example, requests a read operation or a program operation), the host device may provide a logical address to the data storage device 300. The flash translation layer FTL may translate the provided logical address into a physical address of the nonvolatile memory device 100, and perform a requested operation by referring to the converted physical address. In order for such an address translation operation, address translation data, that is, the address mapping table MAP may be included in the flash translation layer FTL.

The wear-leveling module WL may manage wear levels for memory blocks of the nonvolatile memory device 100. Memory cells of the nonvolatile memory device 100 may be aged by program and erase operations. Aged memory cells, that is, worn-out memory cells may cause fails (for example, physical defects). The wear-leveling module WL may manage the program-erase counts of respective memory blocks in such a way as to be leveled, in order to prevent a certain memory block from being worn out earlier than the other memory blocks.

The garbage collection module GC may manage memory blocks where fragmented data are stored. In the case where the nonvolatile memory device 100 is configured by a flash memory device, as described above, it is not possible for the nonvolatile memory device 100 to perform an overwrite operation, and a unit of erase may be larger than a unit of program. For this reason, the nonvolatile memory device 100 may need an operation of collecting valid data dispersed at physically different positions to one place, when a storage space reaches a limit. The garbage collection module GC may perform an operation of collecting valid data fragmented due to performance of a plurality of write operations and a plurality of erase operations, to a collection area.

The bad block management module BB may manage a memory block in which a fail has occurred, among the memory blocks of the nonvolatile memory device 100. As described above, a fail (for example, a physical defect) may occur in a worn-out memory cell. Data stored in a failed memory cell may not be normally read out. Moreover, data may not be normally stored in a failed memory cell. The bad block management module BB may manage a memory block including a failed memory cell, in such a way as to be not used.

The erase operation control module EC may select an erase operation of the nonvolatile memory device 100 according to an operation mode of the data storage device 300, and may provide an erase command corresponding to the selected erase operation, to the nonvolatile memory device 100.

For instance, when the data storage device 300 operates in a background mode, the erase operation control module EC may provide a fine erase command so that memory cells of the nonvolatile memory device 100 are erased by a fine erase operation. The background mode may mean a mode that is performed to manage the nonvolatile memory device 100 when there is no access request from the host device. During the background mode, the address mapping table may be managed, the wear-leveling operation may be performed, the garbage collection operation may be performed, or the bad block management operation may be performed.

For another instance, when the data storage device 300 operates in a normal mode, the erase operation control module EC may provide a normal erase command so that memory cells of the nonvolatile memory device 100 are erased by a normal erase operation. Also, when the data storage device 300 operates in the normal mode, the erase operation control module EC may provide a fine erase command so that memory cells of the nonvolatile memory device 100 are erased by a fine erase operation. That is to say, when the data storage device 300 operates in the normal mode, the erase operation control module EC may provide any one of a normal erase command and a fine erase command to the nonvolatile memory device 100 as the occasion demands.

Figure 11:
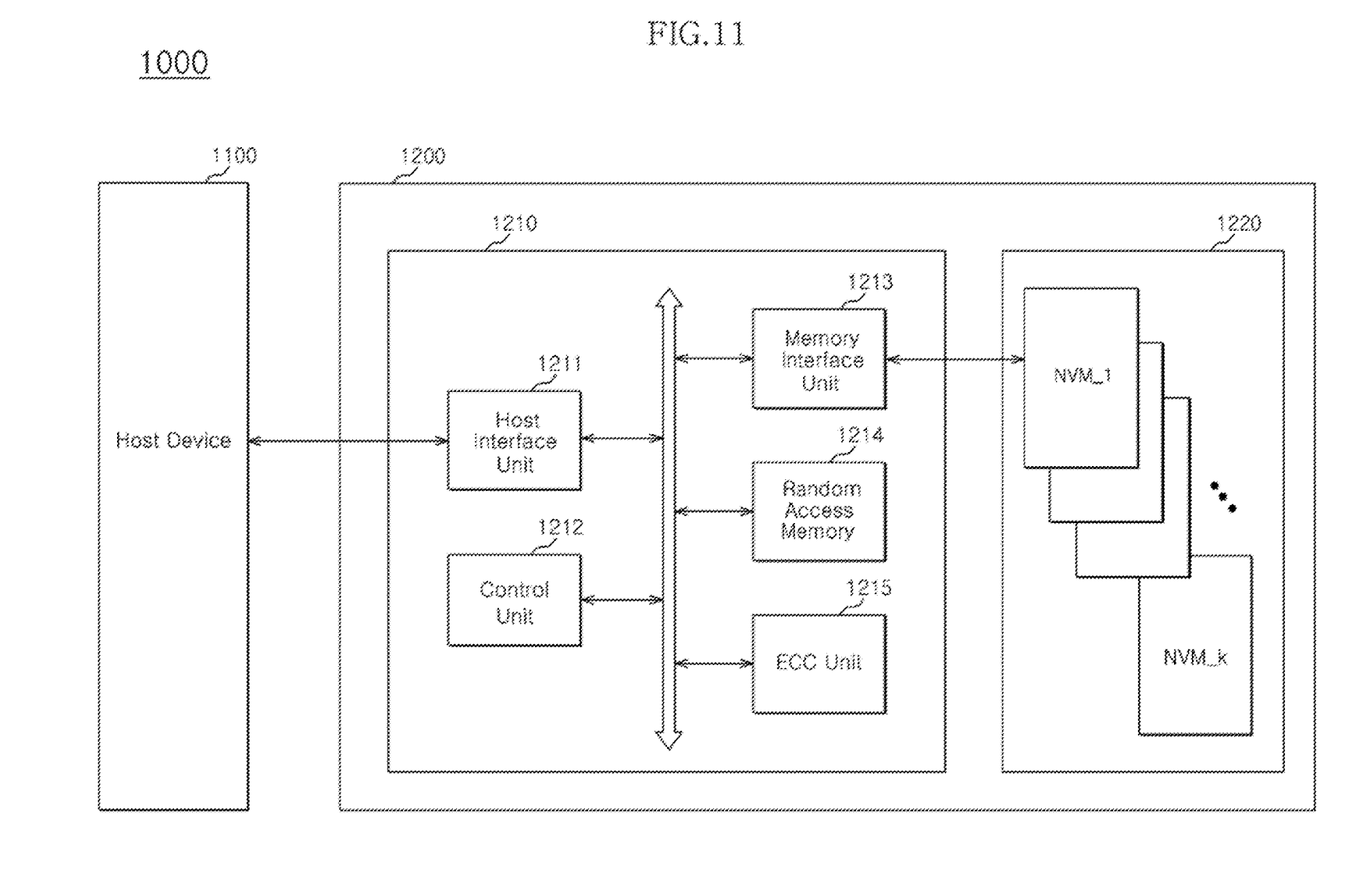
FIG. 11 is a block diagram of a data processing system including a data storage device, according to an embodiment of the invention.

FIG. 11 is a block diagram of a data processing system including a data storage device, according to an embodiment of the invention.

Referring to FIG. 11, a data processing system 1000 may include a host device 1100 and a data storage device 1200 coupled to the host device. The data storage device 1200 may include a controller 1210 and a nonvolatile memory device 1220. The host device 1100 may be or comprise a mobile phone, an MP3 player, a laptop computer, a desktop computer, a game player, a TV, an in-vehicle infotainment system, and the like.

The controller 1210 may include a host interface unit 1211, a control unit 1212, a memory interface unit 1213, a random access memory 1214, and an error correction code (ECC) unit 1215. The controller 1210 may perform the operation of the erase operation control module EC described above with reference to FIG. 10.

The control unit 1212 may control general operations of the controller 1210 in response to a request from the host device 1100. The control unit 1212 may drive a firmware or a software for controlling the nonvolatile memory device 1220.

The random access memory 1214 may be used as a working memory of the control unit 1212. The random access memory 1214 may be used as a buffer memory which temporarily stores the data read from the nonvolatile memory device 1220 or the data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, a serial attached SCSI (SAS) protocol and the like.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The ECC unit 1215 may detect an error of the data read from the nonvolatile memory device 1220. Also, the ECC unit 1215 may be configured to correct the detected error when the detected error is within a correctable range.

The nonvolatile memory device 1220 may be used as a storage medium of the data storage device 1200. The nonvolatile memory device 1220 may include a plurality of nonvolatile memory chips (or dies) NVM_1 to NVM_k. Each of the nonvolatile memory chips (or dies) NVM_1 to NVM_k may perform the normal erase operation and the fine erase operation described above with reference to FIGS. 1 to 8.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and the like.

Figure 12:
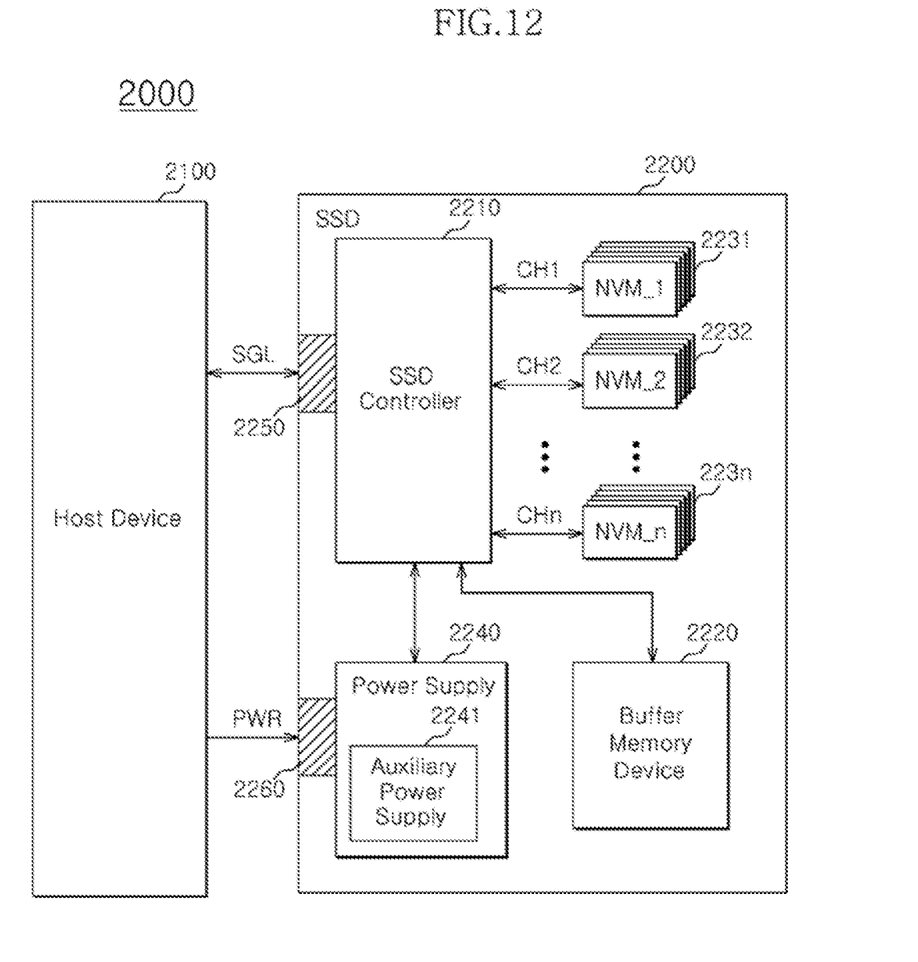
FIG. 12 is a block diagram of a data processing system including a solid state drive (SSD), according to an embodiment of the invention.

FIG. 12 is a block diagram of a data processing system including a solid state drive (SSD), according to an embodiment of the invention.

Referring to FIG. 12, a data processing system 2000 may include a host device 2100 and a solid state drive (SSD) 2200 coupled to the host device 2100.

The SSD 2200 may include an SSD controller 2210, a buffer memory device 2220, nonvolatile memory devices 2231 to 223$n$, a power supply 2240, a signal connector 2250, and a power connector 2260.

The SSD controller 2210 may access the nonvolatile memory devices 2231 to 223$n$ in response to a request from the host device 2100. The SSD controller 2210 may, for example, perform the erase operation of the control module EC described above with reference to FIG. 10.

The buffer memory device 2220 may temporarily store data which are to be stored in the nonvolatile memory devices 2231 to 223$n$. Further, the buffer memory device 2220 may temporarily store data which are read from the nonvolatile memory devices 2231 to 223$n$. The data stored temporarily in the buffer memory device 2220 may be transmitted to the host device 2100 or the nonvolatile memory devices 2231 to 223$n$ under the control of the SSD controller 2210.

The nonvolatile memory devices 2231 to 223$n$ may be used as storage media of the SSD 2200. Each of the nonvolatile memory devices 2231 to 223$n$ may perform the normal and fine erase operations described above with reference to FIGS. 1 to 8.

The nonvolatile memory devices 2231 to 223$n$ may be coupled with the SSD controller 2210 through a plurality of channels CH1 to CHn, respectively. One or more nonvolatile memory devices may be coupled to one channel. The one or more nonvolatile memory devices coupled to one channel may be coupled to the same signal and data bus.

The power supply 2240 may provide power PWR inputted through the power connector 2260, to the inside of the SSD 2200. The power supply 2240 may include an auxiliary power supply 2241. The auxiliary power supply 2241 may supply power to allow the SSD 2200 to be normally terminated when a sudden power-off occurs. The auxiliary power supply 2241 may include super capacitors capable of being charged with power PWR.

The SSD controller 2210 may exchange a signal SGL with the host device 2100 through the signal connector 2250. The signal SGL may include a command, an address, data, and so forth. The signal connector 2250 may be configured by a connector, such as of parallel advanced technology attachment (PATA), serial advanced technology attachment (SATA), small computer system interface (SCSI), serial attached SCSI (SAS), peripheral component interconnection (PCI) and PCI express (PCI-E) protocols, according to the interface scheme between the host device 2100 and the SSD 2200.

Figure 13:
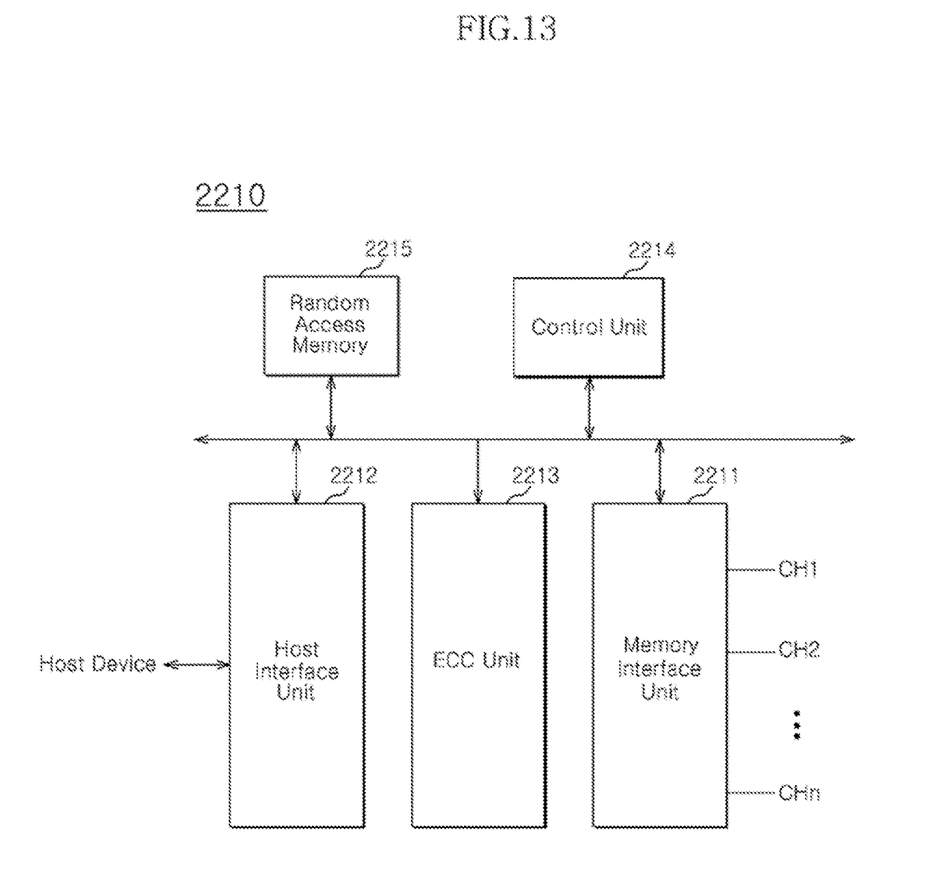
FIG. 13 is a block diagram of an example of an SSD controller of the solid state drive of FIG. 12.

FIG. 13 is a block diagram of an example of the SSD controller 2210 shown in FIG. 12.

Referring to FIG. 13, the SSD controller 2210 may include a memory interface unit 2211, a host interface unit 2212, an error correction code (ECC) unit 2213, a control unit 2214, and a random access memory 2215.

The memory interface unit 2211 may provide a control signal, such as a command and an address to the nonvolatile memory devices 2231 to 223n. Moreover, the memory interface unit 2211 may exchange data with the nonvolatile memory devices 2231 to 223n. The memory interface unit 2211 may scatter the data transmitted from the buffer memory device 2220 to the respective channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may provide an interface with the SSD 2200 in correspondence to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI), PCI express (PCI-E) protocols and the like. In addition, the host interface unit 2212 may perform a disk emulating function of supporting the host device 2100 to recognize the SSD 2200 as a hard disk drive (HDD).

The ECC unit 2213 may generate parity bits based on the data transmitted to the nonvolatile memory devices 2231 to 223n. The generated parity data may be stored along with data in the nonvolatile memory devices 2231 to 223n. The ECC unit 2213 may detect an error of the data read from the nonvolatile memory devices 2231 to 223n. When the detected error is within a correctable range, the ECC unit 2213 may correct the detected error.

The control unit 2214 may analyze and process the signal SGL inputted from the host device 2100. The control unit 2214 may control the operations of the buffer memory device 2220 and the nonvolatile memory devices 2231 to 223n according to a firmware or a software for driving the SSD 2200.

The random access memory 2215 may be used as a working memory for driving the firmware or the software.

Figure 14:
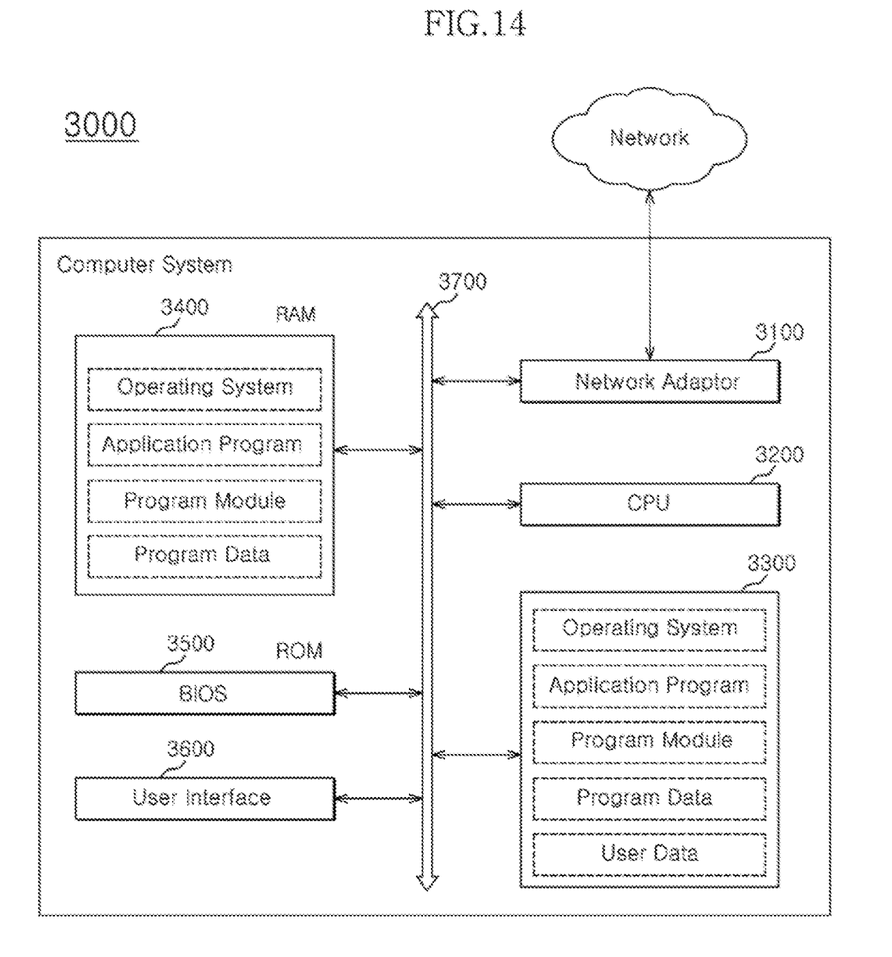
FIG. 14 is a block diagram of an example of a computer system including a data storage device, according to an embodiment of the invention.

FIG. 14 is a block diagram of a computer system including a data storage device, according to an embodiment of the invention. Referring to FIG. 14, a computer system 3000 may include a network adaptor 3100, a central processing unit (CPU) 3200, a data storage device 3300, a RAM 3400, a ROM 3500 and a user interface 3600, all of which may be coupled to a system bus 3700. The data storage device 3300 may be or comprise, for example, the data storage devices 300 and 1200 of FIGS. 9 and 11 or the SSD 2200 of FIG. 12.

The network adaptor 3100 may provide interfacing between the computer system 3000 and external networks. The CPU 3200 performs general operations for driving an operating system residing at the RAM 3400 or an application program.

The data storage device 3300 may store general data necessary in the computer system 3000. For example, an operating system for driving the computer system 3000, an application program, various program modules, program data and user data may be stored in the data storage device 3300.

The RAM 3400 may be used as a working memory of the computer system 3000. Upon booting, the operating system, the application program, the various program modules and the program data necessary for driving programs may be read from the data storage device 3300 and loaded on the RAM 3400. A basic input/output system (BIOS) may be activated before the operating system is driven and stored in the ROM 3500. Information exchange between the computer system 3000 and a user may be enabled through the user interface 3600.

While various embodiments have been described above, it will be understood by those skilled in the relevant art that the described embodiments are examples only of the invention. Accordingly, the nonvolatile memory device and the data storage device including the same described herein should not be limited based on the described embodiments and many other embodiments and or variations of the invention may be envisaged by those skilled in the relevant art without departing from the spirit and or scope of the invention as defined in the appended claims.

What is claimed is:

1. A data storage device comprising:
a nonvolatile memory device; and
a controller suitable for providing a normal erase command or a fine erase command to the nonvolatile memory device;
wherein the nonvolatile memory device is suitable for performing a first normal erase loop according to the normal erase command, wherein the first normal erase loop comprises applying a first normal erase voltage and an erase verify voltage to a first erase target memory cell,
wherein, when it is determined that the first erase target memory cell is not erased by the first normal erase loop, the nonvolatile memory device performs a second normal erase loop in which a second normal erase voltage increased by a first increment from the first normal erase voltage and the erase verify voltage are applied to the first erase target memory cell,
wherein the nonvolatile memory device is suitable for performing a first fine erase loop according to the fine erase command, wherein the first fine erase loop comprises applying a fine normal erase voltage and the erase verify voltage to a second erase target memory cell,
wherein, when it is determined that the second target memory cell is not erased by the first fine erase loop, the nonvolatile memory device performs a second fine erase loop in which a second fine erase voltage increased by a second increment from the first fine erase voltage and the erase verify voltage to the second erase target memory cell, and
wherein a magnitude of the first increment between the normal erase loops is larger than a magnitude of the second increment between the fine erase loops.

2. The data storage device according to claim 1, wherein a level of the first normal erase voltage is higher than a level of the first fine erase voltage.

3. The data storage device according to claim 1, wherein the controller provides the fine erase command to the nonvolatile memory device, while operating in a background mode in which there is no access request from an external device.

4. The data storage device according to claim 1, wherein the controller provides the normal erase command or the fine erase command to the nonvolatile memory device, while operating in a normal mode in which there is an access request from an external device.

5. A nonvolatile memory device comprising:
  memory cells;
  a voltage generator suitable for generating voltages to be provided to the memory cells; and
  a control logic suitable for performing a first normal erase loop in which the voltage generator is controlled so that a first normal erase voltage and an erase verify voltage are applied to erase target memory cells among the memory cells, according to a normal erase command provided from an external device, and performing a first fine erase loop in which the voltage generator is controlled so that a first fine erase voltage and the erase verify voltage are applied to the erase target memory cells, according to a fine erase command provided from an external device,
  wherein, when it is determined that the erase target memory cells are not erased by the first normal erase loop, the control logic performs a second normal erase loop in which the voltage generator is controlled so that a second normal erase voltage increased by a first increment from the first normal erase voltage and the erase verify voltage are applied to the erase target memory cells,
  wherein, when it is determined that the erase target memory cells are not erased by the first fine erase loop, the control logic performs a second fine erase loop in which the voltage generator is controlled so that a second fine erase voltage increased by a second increment from the first fine erase voltage and the erase verify voltage are applied to the erase target memory cells, and
  wherein a magnitude of the first increment between the normal erase loops is larger than a magnitude of the second increment between the fine erase loops.

6. The nonvolatile memory device according to claim 5, wherein a level of the first normal erase voltage is higher than a level of the first fine erase voltage.

\* \* \* \* \*